United States Patent
Zhou

(10) Patent No.: US 10,429,983 B2
(45) Date of Patent: Oct. 1, 2019

(54) METHOD FOR LAUNCHING APPLICATION AND TERMINAL DEVICE

(71) Applicant: Guangdong Oppo Mobile Telecommunications Corp., Ltd., Dongguan, Guangdong (CN)

(72) Inventor: Yibao Zhou, Guangdong (CN)

(73) Assignee: Guangdong Oppo Mobile Telecommunications Corp., Ltd., Dongguan (CN)

(*) Notice: Subject to any disclaimer, the term of this patent is extended or adjusted under 35 U.S.C. 154(b) by 0 days.

(21) Appl. No.: 16/196,497

(22) Filed: Nov. 20, 2018

(65) Prior Publication Data
US 2019/0087048 A1    Mar. 21, 2019

Related U.S. Application Data

(63) Continuation of application No. 16/051,976, filed on Aug. 1, 2018, which is a continuation of application No. PCT/CN2017/079798, filed on Apr. 7, 2017.

(30) Foreign Application Priority Data

Apr. 28, 2016    (CN) .......................... 2016 1 0281926

(51) Int. Cl.
G06F 3/041        (2006.01)
G06F 3/0488       (2013.01)
(Continued)

(52) U.S. Cl.
CPC .......... *G06F 3/0414* (2013.01); *G06F 1/3231* (2013.01); *G06F 3/017* (2013.01);
(Continued)

(58) Field of Classification Search
CPC .. G06F 3/0414; G06F 3/0488; G06F 3/04883; H03K 17/945; Y02D 10/24
See application file for complete search history.

(56) References Cited

U.S. PATENT DOCUMENTS

2011/0082616 A1* 4/2011 Small ..................... B60K 35/00
                                                    701/31.4
2012/0071149 A1   3/2012 Bandyopadhyay et al.
(Continued)

FOREIGN PATENT DOCUMENTS

CN        103019600 A       4/2013
CN        103869947 A       6/2014
(Continued)

*Primary Examiner* — Robert J Michaud
(74) *Attorney, Agent, or Firm* — Young Basile Hanlon & MacFarlane, P.C.

(57) ABSTRACT

A method for launching an application and a mobile terminal are provided. The method includes the following operations. Whether a touch operation of a user received on a touch display screen of a mobile terminal belongs to a touch operation set in a mapping relationship with an application set of the mobile terminal is judged, in response to the touch operation being detected when the touch display screen is in a screen-off mode. A proximity sensor in an off-state or a dormant-state is started based on a judgment that the touch operation belongs to the touch operation set. Existence of an occlusion within a preset distance in front of the touch display screen is detected with the proximity sensor. An application corresponding to the touch operation is launched when no occlusion exists.

18 Claims, 7 Drawing Sheets

(51) Int. Cl.
*H03K 17/945* (2006.01)
*G06F 1/3231* (2019.01)
*G06F 3/01* (2006.01)
*G06F 3/0484* (2013.01)

(52) U.S. Cl.
CPC ........ *G06F 3/0488* (2013.01); *G06F 3/04842* (2013.01); *G06F 3/04883* (2013.01); *H03K 17/945* (2013.01); *H03K 2217/94052* (2013.01); *Y02D 10/24* (2018.01)

(56) References Cited

U.S. PATENT DOCUMENTS

2015/0185837 A1* 7/2015 Whitney ................. G06F 3/014
 345/156
2016/0378334 A1* 12/2016 Liu ....................... G06F 3/0481
 715/794

FOREIGN PATENT DOCUMENTS

| | | |
|---|---|---|
| CN | 104049708 A | 9/2014 |
| CN | 104267901 A | 1/2015 |
| CN | 104468953 A | 3/2015 |
| CN | 104750421 A | 7/2015 |
| CN | 105334966 A | 2/2016 |
| CN | 105353967 A | 2/2016 |
| EP | 2857932 A1 | 4/2015 |

* cited by examiner

METHOD FOR LAUNCHING APPLICATION AND TERMINAL DEVICE

CROSS-REFERENCE TO RELATED APPLICATION(S)

This application is a continuation of U.S. patent application Ser. No. 16/051,976, filed on Aug. 1, 2018, which is a continuation of International Application No. PCT/CN2017/079798, filed on Apr. 7, 2017, which claims priority to Chinese Patent Application No. 201610281926.1, filed on Apr. 28, 2016, the contents of all of which are hereby incorporated by reference in their entireties.

TECHNICAL FIELD

This disclosure relates to the technical field of terminal devices, and more particularly to a method for launching an application and a mobile terminal.

BACKGROUND

With the intelligentization and personalization of terminal devices, a user can quickly launch an application through a specific and simple gesture operation on a touch display screen of the terminal device. For example, when a touch display screen of the terminal device is in a screen-off mode (that is, the terminal device is suspending), a touch gesture operation such as clicking or long-pressing can be operated on the touch display screen to launch an application corresponding to the touch gesture.

SUMMARY

Implementations of the present disclosure provide a method for launching an application and a mobile terminal.

According to a first aspect of the present disclosure, a method for launching an application is provided. The method includes the following.

Whether a touch operation of a user received on a touch display screen of a mobile terminal belongs to a touch operation set in a mapping relationship with an application set of the mobile terminal is judged, in response to the touch operation being detected when the touch display screen is in a screen-off mode. A proximity sensor in an off-state or a dormant-state is started based on a judgment that the touch operation belongs to the touch operation set. Detect, with the proximity sensor, existence of an occlusion within a preset distance in front of the touch display screen. An application corresponding to the touch operation is launched when no occlusion exists. The launching an application corresponding to the touch operation includes: retrieving at least one application in a mapping relationship with the touch operation; detecting, with the proximity sensor, movement of a target object in relative to the touch display screen; launching, among the at least one application, an application corresponding to the movement of the target object in relative to the touch display screen. The detecting, with the proximity sensor, existence of an occlusion within a preset distance in front of the touch display screen includes: determining at least one detection zone within the preset distance in front of the touch display screen; detecting, with the proximity sensor, occlusion coverage area of each detection zone of the at least one detection zone; judging whether total occlusion coverage area of all detection zones is greater than a preset threshold area; determining that there is no occlusion based on a judgment that the total occlusion coverage area of all detection zones is not greater than the preset threshold area; where the importance of each detection zone is different, the occlusion coverage area of each detection zone is obtained by multiplying the occlusion coverage area and a corresponding weight value representing the importance of the detection zone.

According to a second aspect of the present disclosure, a mobile terminal is provided. The mobile terminal includes a memory, a processor, and at least one proximity sensor. The processor is coupled with the memory and the at least one proximity sensor. The processor is configured to invoke executable program codes stored in the memory to perform part or all of the operations described in any method of the first aspect of the implementations of the present disclosure.

According to a third aspect of the present disclosure, a computer storage medium is provided. The computer storage medium is configured to store programs. The programs, when executed, are operable to perform part or all of the operations described in any method of the first aspect of the implementations of the present disclosure.

BRIEF DESCRIPTION OF THE DRAWINGS

To illustrate technical solutions embodied by the implementations of the present disclosure more clearly, the following briefly introduces the accompanying drawings required for describing the implementations. Apparently, the accompanying drawings in the following description merely illustrate some implementations of the present disclosure. Those of ordinary skill in the art may also obtain other drawings based on these accompanying drawings without creative efforts.

DETAILED DESCRIPTION

Figure 1:
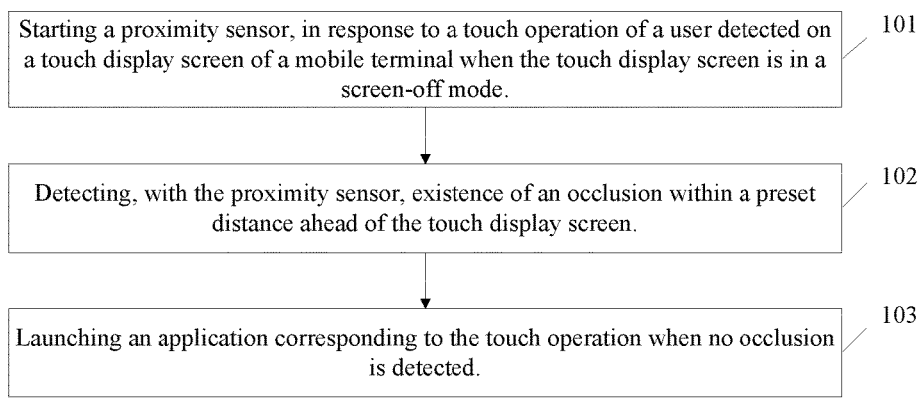
FIG. 1 is a schematic flow chart illustrating a method for launching an application according to a first method implementation of the present disclosure.

Implementations of the present disclosure provide a method for launching an application and a terminal device, which can reduce power consumption of the terminal device during recognition of an accidental operation of a user.

Hereinafter, technical solutions embodied by the implementations of the disclosure will be described in a clear and comprehensive manner in reference to the accompanying drawings intended for the implementations. It is evident that the implementations described herein constitute merely some rather than all of the implementations of the disclosure, and those of ordinary skill in the art will be able to derive other implementations based on these implementations without making inventive efforts, with all such derived implementations shall all fall in the protection scope of the disclosure.

The terms "first", "second", "third", and "fourth" used in the specification, the claims, and the accompany drawings of the present disclosure are used to distinguish different objects rather than describe a particular order. In addition, the terms "include", "comprise", and "have" as well as variations thereof are intended to cover non-exclusive inclusion. For example, a process, method, system, product, or apparatus including a series of operations or units is not limited to the listed operations or units, it can optionally include other operations or units that are not listed; alternatively, other operations or units inherent to the process, method, product, or device can be included either.

The term "embodiment" or "implementation" referred to herein means that a particular feature, structure, or feature described in connection with the implementation may be in at least one implementation of the present disclosure. The phrase appearing in various places in the specification does not necessarily refer to the same implementation, nor does it refer an independent or alternative implementation that is mutually exclusive with other implementations. It is expressly and implicitly understood by those skilled in the art that an implementation described herein may be combined with other implementations. The term "module" may be used to refer to one or more physical or logical components or elements of a system. In some implementations, a module may be a distinct circuit, while in other implementations a module may include a plurality of circuits.

The term "screen-off mode", also known as "screen-off state", refers to a mode or state in which a backlight of a terminal device is powered off. Similarly, the term "screen-on mode", also known as "screen-on state", refers to a mode or state in which a backlight of a terminal device is powered on. In the screen-on mode, the display screen can be lighted with different brightness.

In the related art, a user can quickly launch an application through a specific and simple gesture operation on a touch display screen of a terminal device such as a mobile terminal. Although the above approach can quickly open an application, the user can easily misoperate in this situation. Currently, one manner in which the terminal device prevents a user from misoperation or accidental operation is to be equipped a device such as a proximity sensor in the terminal device, and the proximity sensor is configured to determine whether the terminal device is in an occluded state where a misoperation is easily occur. When the proximity sensor determines that the terminal device is in an occluded state, the function of launching an application through a simple gesture operation will be disabled. When the proximity sensor determines that the terminal device is not in the occluded state, the function of launching an application through a simple gesture operation will be enabled again. However, the proximity sensor needs to operate at all times even when the terminal device is in a standby mode so as to determine whether the terminal device is currently occluded. As a result, continuous operation of the proximity sensor increases the power consumption of the terminal device.

According to implementations of the present disclosure, the proximity sensor is started when a touch operation of a user on the touch display screen of the terminal device is detected. Existence of an occlusion within a preset distance in front of the touch display screen will be detected with the proximity sensor to judge whether the touch operation of the user is an accidental operation. When there is no occlusion within the preset distance in front of the touch display screen, it indicates that the touch operation of the user is not an accidental operation and accordingly, an application corresponding to the touch operation can be launched. In this way, the user can quickly launch the application through the touch operation, while extra power consumption of the terminal device caused by accidental operations of the user can be avoid. In addition, the proximity sensor is triggered to start when there is no occlusion within the preset distance in front of the touch display screen, which can further reduce power consumption of the terminal device caused by operating the proximity sensor for a long time.

"Terminal device" in the implementations of the disclosure may include a smart phone (such as an android® mobile phone, an iOS® mobile phone, a Windows® phone mobile phone, etc.), a tablet computer, a palmtop computer, a notebook computer, a mobile internet device (MID), or a wearable device, or the like. The terminal devices mentioned above are merely some examples rather than exhaustion, the present disclosure includes but not limited to the above-mentioned terminal device.

In implementations of the disclosure, methods for launching an application(s) is provided, in which a proximity sensor of a terminal device will be started or enabled when a touch operation of a user on a touch display screen of the terminal device in a screen-off mode is detected, then an application corresponding to the touch operation will be launched if there is no occlusion within a preset distance in front of the touch display screen. Details will be given below.

FIG. 1 is a schematic flow chart illustrating a method for launching an application according to a first method implementation of the present disclosure. The method can be applicable to the above terminal device. As illustrated in FIG. 1, the method begins at block 101.

At block 101, a proximity sensor is started in response to a touch operation of a user detected on a touch display screen of the terminal device when the touch display screen is in a screen-off mode.

In one implementation, the touch operation can be detected via a touch sensor of the terminal device. In one implementation, when the touch operation of the user on the touch display screen of the terminal device is detected in the screen-off mode of the touch display screen, there is a possibility that the user performs an accidental operation on the touch display screen and therefore, the proximity sensor needs to be started to further detect whether the touch operation is an accidental operation. The terminal device can be equipped with at least one proximity sensor. When more than one proximity sensor is provided, all or part of the more than one proximity sensor may be started according to a position of the touch operation or other environmental factors. In another implementation, when the touch display screen of the terminal device is in a screen-off mode, the proximity sensor can be turned off or in a suspending state, so as to reduce power consumption of the terminal device when the touch screen of the terminal device is in the screen-off mode. Starting the proximity sensor, as mentioned in the context herein, may also include a process of awakening a sensor that is in a suspending state, the disclosure is not limited herein. The proximity sensor of the implementations of the present disclosure can be an infrared ray proximity sensor, a linear proximity sensor, an ultrasonic proximity sensor, or the like.

At block 102, existence of an occlusion within a preset distance in front of the touch display screen is detected with the proximity sensor.

In one implementation, after the proximity sensor is started, whether there is an occlusion within the preset distance in front of the touch display screen can be detected via the proximity sensor. For example, the phrases of "in front of the touch display screen" mentioned herein includes but not limited to a direction in which part of the touch display screen is covered or occluded (in other words, blocked) and in which, the occlusion can form a projection on the touch display screen. The occlusion can affect the proximity sensor's judgment on a proximity distance. To this end, a threshold distance may be set in advance (in the following, "preset distance" for short). When the proximity sensor detects that there is an object within the preset distance range, it indicates that the object is an occlusion of the touch screen of the terminal device. The preset distance can be in a direction perpendicular to the touch display screen. Alternatively, the preset distance can be in any direction on a hemisphere with the preset distance as the radius of the hemisphere and a coordinate point of the touch operation on the touch display screen as a center of the hemisphere. Alternatively, the preset distance can be in any direction on a partial hemisphere, implementations of the present disclosure are not limited thereto.

As one implementation, at least one detection zone within the preset distance in front of the touch display screen can be determined, and whether the total of occlusion coverage area of each detection zone is greater than a preset threshold area is determined by counting the total coverage area of occlusion(s) of each detection zone of the at least one detection zone. When the total is greater than the preset threshold area, it indicates that there is an occlusion, that is, an accidental operation may be performed on the touch display screen by the user, and operations at S103 described below will be skipped and the touch display screen will remain in the screen-off mode. When the total is smaller than the preset threshold area, it indicates that there is no occlusion, that is, the user wants to launch an application quickly through the touch operation, and accordingly, operations at S103 described below will be performed. In addition, when a proximity sensor is started, at least one detection zone capable of being sensed by the proximity sensor can be determined. Similarly, when multiple proximity sensors are started, at least one detection zone capable of being sensed generally by the multiple proximity sensors can be determined, for example, the at least one detection zone can be determined by taking an operating position of the touch operation on the touch display screen into consideration.

As one implementation, other means can also be adopted to detect existence of an occlusion within the preset distance in front of the touch display screen. As an example, the proximity sensor is an infrared ray proximity sensor, in this case, the proximity sensor is configured to detect an object in front of the touch display screen through emitting one or more infrared rays, and to determine whether the distance between the object and the touch display screen is within the preset distance based on a duration of reflection of the infrared rays emitted. When the object is within the preset distance, it can be determined that the object is an occlusion, that is, there is an occlusion within the preset distance in front of the touch display screen. As another example, whether or not a coverage range of the object has actually occluded the touch display screen can be further determined with aid of a scanning area of the infrared rays. When the coverage range has not occluded the touch display screen, it indicates that there is no occlusion. Otherwise, when the occlusion coverage range has occluded the touch display screen, it indicates that there is an occlusion. It should be understood that, the above operations may also be combined with each other to determine whether there is an occlusion, the implementations of the present disclosure are not limited thereto.

At block 103, an application corresponding to the touch operation is launched when no occlusion is detected.

In one implementation, when there is no occlusion within the preset distance in front of the touch display screen, it indicates that the touch operation of the user on the touch display screen is not an accidental operation, and the application corresponding to the touch operation can be launched. As an example, after it is determined that the touch operation is not an accidental operation, the application corresponding to the touch operation can be further determined, and then the application can be launched on the terminal device. Alternatively, the application, such as GPS positioning and the like, can run in the background after being launched, or a startup interface (also known as a welcome interface) of the application can be displayed on a display interface of the touch display screen.

According to the implementations of the present disclosure, the proximity sensor is started in response to detecting the touch operation of the user on the touch display screen of the terminal device when the touch display screen is in the screen-off mode. Thereafter, existence of an occlusion within the preset distance in front of the touch display screen can be determined with the proximity sensor, so as to determine whether the touch operation of the user is an accidental operation. When there is no occlusion within the preset distance, it means that the touch operation of the user is not an accidental operation, and the application corresponding to the touch operation can be launched, thereby realizing quick launch of an application through the touch operation while avoiding extra power consumption of the terminal device caused by the accidental operation of the user. In addition, the proximity sensor is triggered on condition that there is no occlusion within the preset distance in front of the touch display screen, which can further reduce power consumption of the terminal device caused by long-time operating of the proximity sensor.

Figure 2:
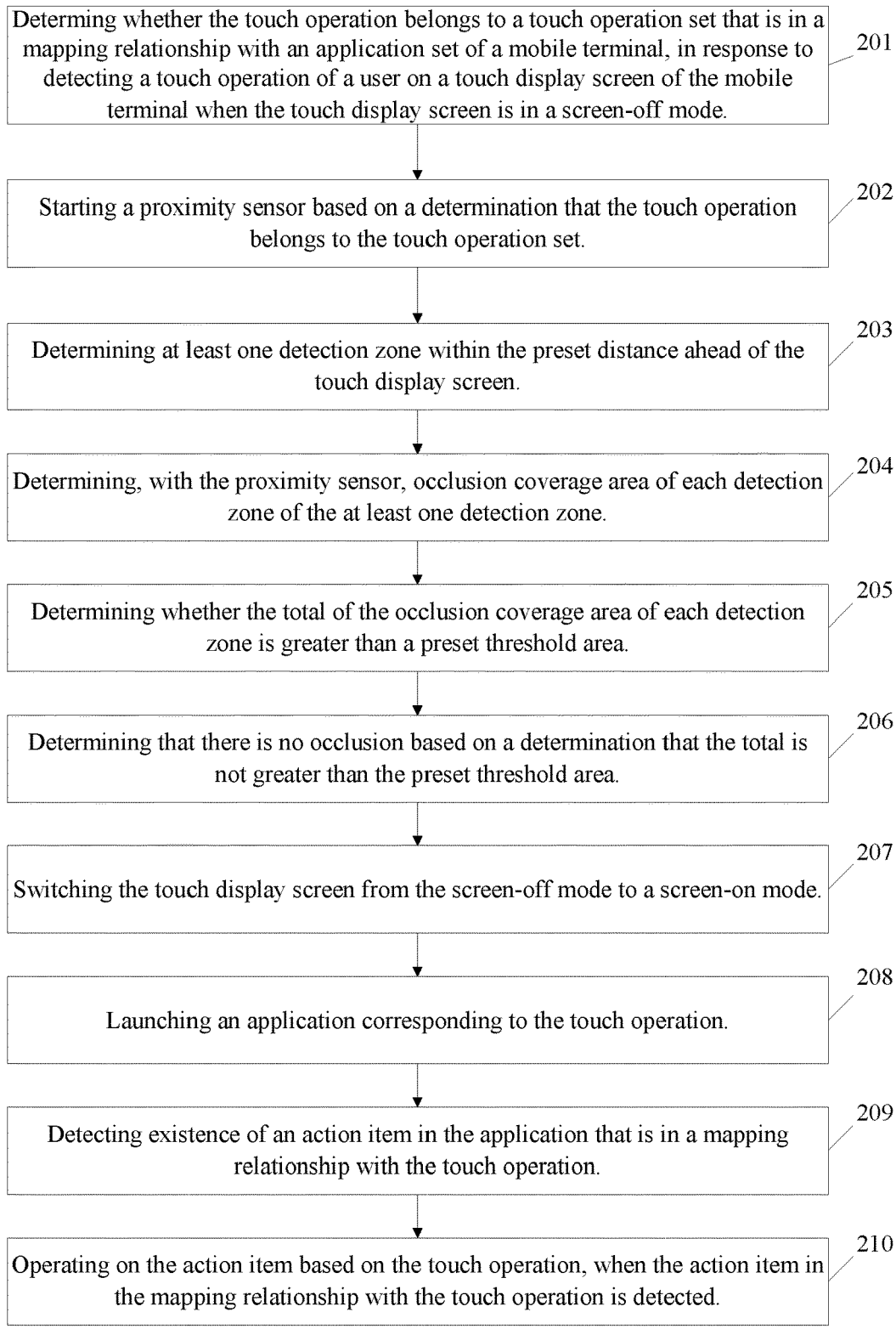
FIG. 2 is a schematic flow chart illustrating a method for launching an application according to a second method implementation of the present disclosure.

FIG. 2 is a schematic flow chart illustrating a method for launching an application according to a second method implementation of the present disclosure. The method can be applicable to the above terminal device. As illustrated in FIG. 2, the method begins at block 201.

At block 201, determine whether the touch operation belongs to a touch operation set that is in a mapping relationship with (in other words, corresponding to) an application set of the terminal device, in response to a touch operation of a user detected on a touch display screen of the terminal device when the touch display screen is in a screen-off mode.

In one implementation, when the touch operation of the user on the touch display screen of the terminal device is detected in the screen-off mode of the touch display screen, first determine whether the touch operation belongs to the touch operation set that is in a mapping relationship with the application set of the terminal device. In other words, whether the touch operation is configured to launch the application is determined first. For instance, a mapping relationship table of the application set and the touch operation set can be pre-stored in the terminal device, where applications in the application set may correspond to one or more touch operations belong to the touch operation set. Each entry of the mapping relationship table indicates one application and one or more touch operations corresponding thereto. When a touch operation of a user on the touch display screen is detected, search the mapping relationship table for the touch operation detected. When the touch operation is found in the table, it indicates that the touch operation corresponds to an application and the application will be launched. When the touch operation cannot be found in the table, it indicates that the touch operation does not belong to the touch operation set which is in a mapping relationship with the application set; based on this, it can be further determined that the touch operation is not intended to quickly launch the application in the screen-off mode, in other words, the touch operation detected can be regarded as an accidental operation.

For example, the touch operation in the above mapping relationship table can be a touch gesture operation, a touch pressure, and the like. As an example, a touch operation for launching Application 1 may include one or more of the follows: a double-click touch operation, a touch operation of a V-shaped touch gesture, a touch operation with a touch pressure reaching a first preset threshold, and other touch operations. As another example, a touch operation for launching Application 2 may include one or more of the follows: a touch operation with the number of clicks exceeding a preset threshold, a touch operation of an O-shaped touch gesture, and a touch operation with a touch pressure reaching a second preset threshold. The implementations of the present disclosure are not particularly restricted.

At block 202, the proximity sensor is started based on a determination that the touch operation belongs to the touch operation set.

In one implementation, when the touch operation belongs to the touch operation set, it indicates that the touch operation is configured to launch an application of the terminal device, and the proximity sensor can be started to further determine whether the touch operation is made based on user's intention or it is an accidental operation of the user. For instance, the terminal device can be equipped with at least one proximity sensor. When more than one proximity sensor is provided, all or part of the more than one proximity sensor may be started according to a position of the touch operation or other environmental factors. In a possible implementation, when the touch display screen of the terminal device is in a screen-off mode, the proximity sensor can be turned off or in a suspending state, so as to reduce power consumption of the terminal device when the touch display screen of the terminal device is in a screen-off mode. Starting the proximity sensor, as mentioned in the context herein, may also include a process of awakening a sensor that is in a suspending state, the implementations of the present disclosure are not limited herein. The proximity sensor of the implementations of the present disclosure may be an infrared ray proximity sensor, a linear proximity sensor, an ultrasonic proximity sensor, or the like.

At block 203, at least one detection zone within the preset distance in front of the touch display screen is determined.

In one implementation, after the proximity sensor is started, the at least one detection zone within the preset distance in front of the touch display screen can be determined for detecting by the proximity sensor. For example, a detection range of the proximity sensor can be determined first, and the detection range is divided into the at least one detection zone. Alternatively, the at least one detection zone is determined according to an operating position of the touch operation on the touch display screen. Alternatively, the at least one detection zone can be determined by a combination of the above two manners.

At block 204, occlusion coverage area of each detection zone of the at least one detection zone is detected with the proximity sensor.

In one implementation, after the at least one detection zone is determined, the occlusion coverage area of each detection zone of the at least one detection zone can be detected with the proximity sensor. For instance, in the case that one or more proximity sensors are started, the at least one detection zone can be determined based on a range that the proximity sensor(s) can detect, the operating position of the touch operation, or a combination of the above two manners. Then the proximity sensor can detect the occlusion coverage area of each detection zone of the at least one detection zone determined. The importance or priority of each detection zone may be preset to be the same or different. For example, when the importance of each detection zone is different, for each detection zone, the occlusion coverage area thereof can be represented as the result obtained by multiplying the occlusion coverage area and a corresponding weight value representing the importance of the detection zone.

At block 205, for each detection zone, determine whether the total of the occlusion coverage area thereof is greater than a preset threshold area.

In one implementation, after the occlusion coverage area of each detection zone is determined as mentioned above, the total of the occlusion coverage area of each detection zone can be obtained. When the total of the occlusion coverage area of each detection zone is greater than the preset threshold area, it means that there is an occlusion within the preset distance in front of the touch display screen. On the other hand, when the total of the occlusion coverage area of each detection zone is less than the preset threshold area, it means that there is no occlusion within the preset distance in front of the touch display screen, which in turn indicates that the user wants to launch the application quickly through the touch operation on the touch display screen. Those operations are listed below.

At block 206, determine that there is no occlusion when the total is not greater than the preset threshold area.

At block 207, the touch display screen is switched from the screen-off mode to a screen-on mode.

In one implementation, when it is determined that there is no occlusion within the preset distance in front of the touch display screen, the touch display screen can be switched from the screen-off mode to the screen-on mode, to prepare for displaying a startup interface of the application or a function interface after the application is launched. Before the application is launched, the user may be further prompted to enter permission for launching the application when the touch display screen is in the screen-on mode, to ensure the security of the application.

At block 208, an application corresponding to the touch operation is launched.

In one implementation, after the terminal device has switched the touch display screen from the screen-off mode to the screen-on mode, the application corresponding to the touch operation of the user can be launched. A startup interface or a function interface of the application can be displayed on the touch display screen. In this case, the proximity sensor can be closed or enter a suspending state.

At block 209, in the application, existence of an action item in a mapping relationship with the touch operation is detected.

In one implementation, the above touch operation of the user can be in a mapping relationship with action items of the application. For example, when the application is a music player, action items of the application can relate to "previous song", "next song", "fast forward", "fast rewind", "volume adjustment", and so on. Each action item corresponds to a touch operation, for instance, when the touch operation is to slide the screen to the right, an action item corresponding thereto is "fast forward". By further detecting whether there is an action item in a mapping relationship with the above touch operation, it is possible to further speed up the process of launching an application, since operations corresponding to action items of the application can be completed while launching the application, richer operation functions can be achieved with simpler operations.

At block 210, operate on the action item based on the touch operation, when the action item in the mapping relationship with the touch operation is detected.

In one implementation, when it is detected that there is the action item in a mapping relationship with the touch operation, operate on the action item in the application based on the touch operation. For example, when the action item corresponding to the above touch operation is to adjust volume, the volume of the application can be adjusted according to the touch operation. Further, suppose the touch operation refers to a touch pressure, the volume of the application will be reduced when the touch pressure of the touch operation is reduced; likewise, the volume of the application will be increased accordingly when the touch pressure of the touch operation is increased. It should be appreciated that, there may be other mapping relationships between the touch operation and action items of the application, the present disclosure is not limited thereto.

According to the implementations of the present disclosure, after the terminal device detects the touch operation of the user on the touch display screen in the screen-off mode of the touch display screen, the terminal device may further recognize the touch operation so as to determine, with the proximity sensor, whether the touch operation is an accidental operation, and thereby improving the accuracy of recognizing whether the touch operation is an accidental operation. Further, when determining that the touch operation is not an accidental operation and the application is launched, operate on the action item of the application based on the touch operation, which simplifies user operation in terms of operations on the application.

Figure 3A:
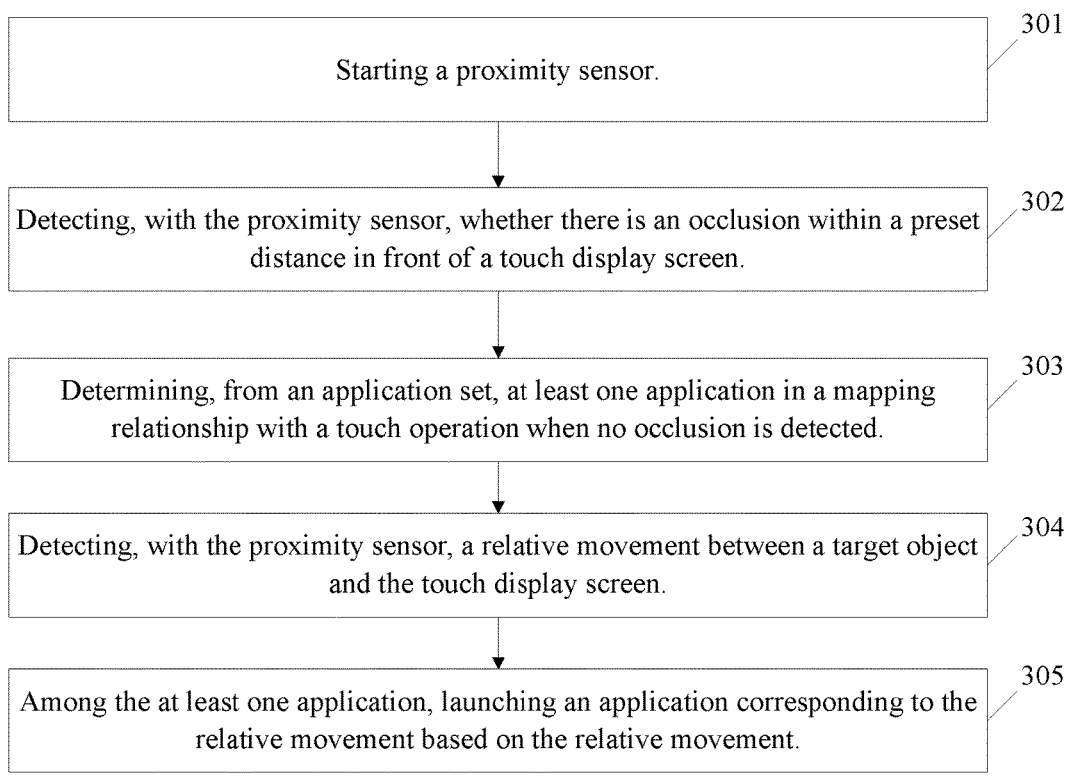
FIG. 3A is a schematic flow chart illustrating a method for launching an application according to a third method implementation of the present disclosure.

FIG. 3A is a schematic flow chart illustrating a method for launching an application according to a third method implementation of the present disclosure. Combined with the first method implementation illustrated in FIG. 1 and the second method implementation illustrated in FIG. 2, the method illustrated in FIG. 3A mainly describes operations performed when a touch operation corresponds to multiple applications to be launched. That is, when executing the method of the first method implementation or the second method implementation, the method described in the third method implementation may also be further performed alternatively or in addition to the corresponding operations. The method is applicable to the above terminal device. As illustrated in FIG. 3A, the method begins at block 301.

At block 301, a proximity sensor is started, for example, when a touch operation is detected.

At block 302, whether there is an occlusion within a preset distance in front of a touch display screen is detected with the proximity sensor.

In one implementation, for details of the operations at S301 to S302, reference can be made to the corresponding operations described in the foregoing implementations and will not be repeated here.

At block 303, at least one application in a mapping relationship with the touch operation is determined (for example, retrieved) from an application set when no occlusion is detected.

In one implementation, when no occlusion within the preset distance in front of the touch display screen is detected with the proximity sensor, proceed to the process of launching an application. For instance, the at least one application in a mapping relationship with the touch operation can be determined from the application set of the terminal device. In implementations of the present disclosure, the touch operation may correspond to multiple applications. If the touch operation is not an accidental operation of the user, which application of the multiple applications corresponding to the touch operation will be launched may refer to the following operations. It should be understood that, more than one application can be launched at the same time through the touch operation.

At block 304, a movement of a target object in relative to the touch display screen (hereinafter, relative movement for short) is detected with the proximity sensor.

In one implementation, after at least one application in a mapping relationship with the touch operation is determined, the relative movement between the target object and the touch display screen can be further determined with the proximity sensor. The proximity sensor can determine the target object with aid of a device such as a camera provided in the terminal device, and the target object can be the face, hands, or other objects having target features of the user. Thereafter, the relative movement between the target object and the touch display screen is detected. The movement relationship can be a close relationship, a distant relationship, and the like. It should be appreciated that, with aid of other sensors, the proximity sensor can also detect other movement relationships such as a left-shift relationship or a right-shift relationship. Different movement relationships may correspond to different applications determined.

At block 305, among the at least one application, an application corresponding to the relative movement is launched.

In one implementation, after the relative movement between the target object and the touch display screen is detected, based on the relative movement, the application corresponding to the relative movement can be launched from the determined at least one application. As an example, different movement relationships may correspond to the different applications among the at least one application. As another example, the determined at least one application may be sorted with sequence numbers, and different movement relationships correspond to different sequence numbers. As yet another example, the movement relationship may also include parameters such as movement acceleration, a movement rate, a movement range and the like of the target object in relative to the touch display screen. A specific application can be determined according to different movement parameters of a movement relationship.

According to implementations of the present disclosure, the terminal device can launch multiple applications with the proximity sensor, or determine an application to be launched from the at least one application corresponding to the touch operation based on the relative movement between the target object and the touch display screen. In this case, launching of an application becomes more accurate.

Figure 3B:
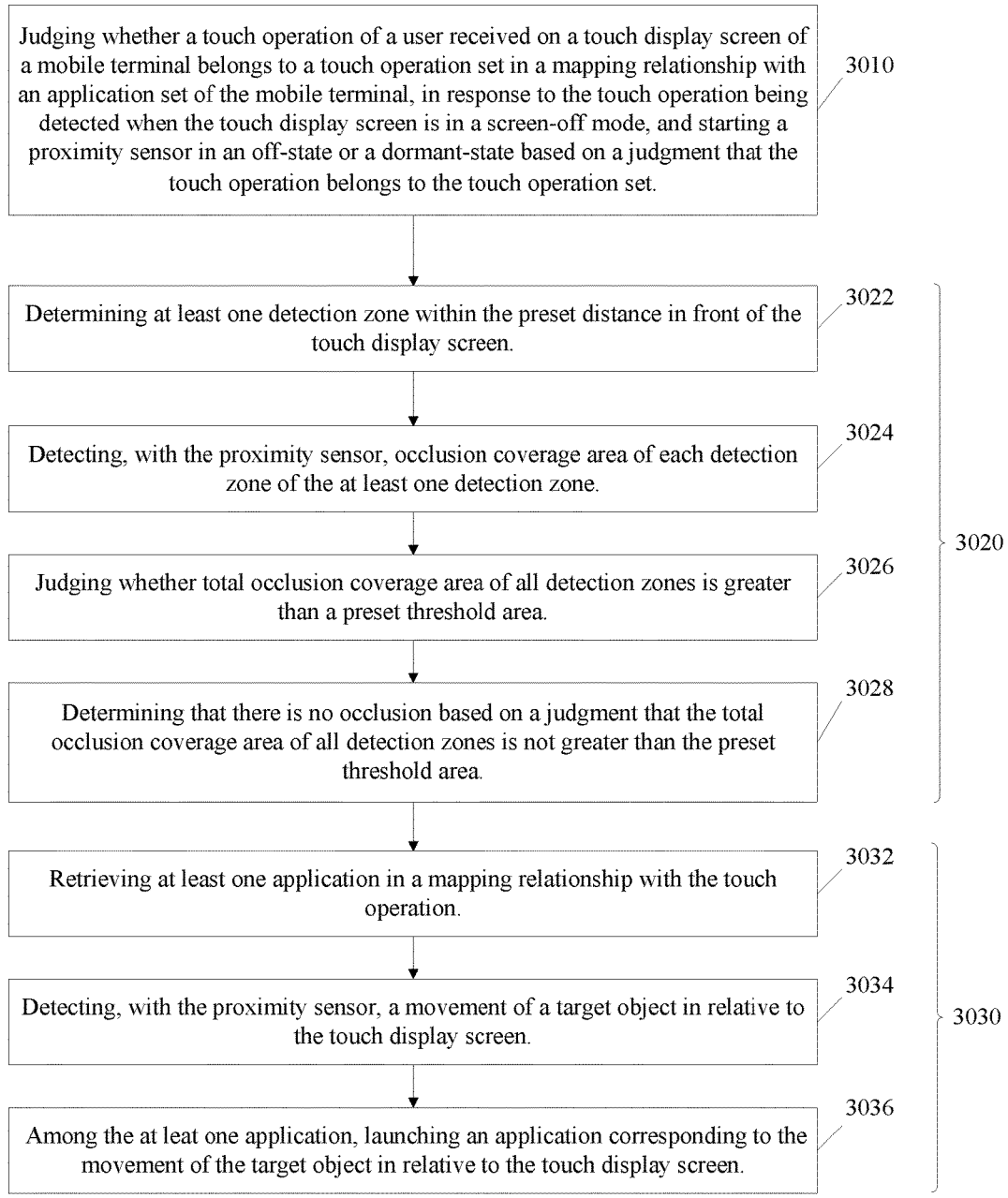
FIG. 3B is a schematic flow chart illustrating a method for launching an application according to a fourth method implementation of the present disclosure.

FIG. 3B is a schematic flow chart illustrating a method for launching an application according to a fourth method implementation of the present disclosure. The method can be applicable to the above terminal device. As illustrated in FIG. 3B, the method begins at block 3010.

At block 3010, whether a touch operation of a user received on a touch display screen of a mobile terminal belongs to a touch operation set in a mapping relationship with an application set of the mobile terminal is judged, in response to the touch operation being detected when the touch display screen is in a screen-off mode, and a proximity sensor in an off-state or a dormant-state is started based on a judgment that the touch operation belongs to the touch operation set.

At block 3020, the proximity sensor detects existence of an occlusion within a preset distance in front of the touch display screen.

As an implementation, operations at the block 3020 further include the following.

At block 3022, determine at least one detection zone within the preset distance in front of the touch display screen.

At block 3024, the proximity sensor detects occlusion coverage area of each detection zone of the at least one detection zone.

At block 3026, judge whether total occlusion coverage area of all detection zones is greater than a preset threshold area.

At block 3028, determine that there is no occlusion based on a judgment that the total occlusion coverage area of all detection zones is not greater than the preset threshold area.

It should be noted that, the importance of each detection zone is different. The occlusion coverage area of each detection zone is obtained by multiplying the occlusion coverage area and a corresponding weight value representing the importance of the detection zone.

At block 3030, an application corresponding to the touch operation is launched when no occlusion exists.

As an implementation, operations at the block 3030 further include the following.

At block 3032, at least one application in a mapping relationship with the touch operation is retrieved.

At block 3034, the proximity sensor detects movement of a target object in relative to the touch display screen.

At block 3036, among the at least one application, an application corresponding to the movement of the target object in relative to the touch display screen is launched.

Figure 4:
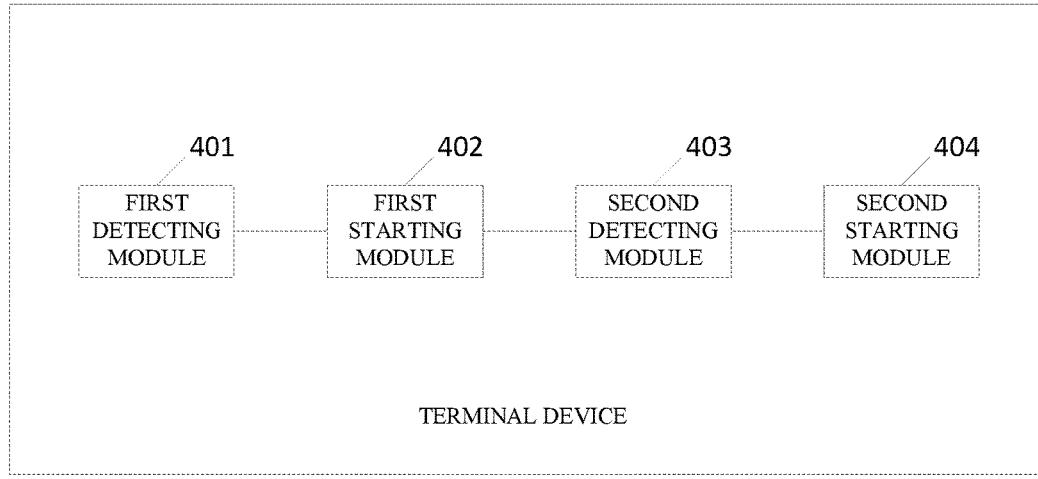
FIG. 4 is a schematic structural diagram illustrating a terminal device according to a first terminal implementation of the present disclosure.

FIG. 4 is a schematic structural diagram illustrating a terminal device according to a first terminal implementation of the present disclosure. As illustrated in FIG. 4, the terminal device includes a first detecting module 401, a first starting module 402, a second detecting module 403, and a second starting module 404.

The first detecting module 401 can be embodied as a touch sensor and is configured to detect a touch operation of a user on a touch display screen of the terminal device when the touch display screen is in a screen-off mode.

The first starting module 402 can be embodied as a controller and is configured to start a proximity sensor, in response to the first detecting module 401 detecting the touch operation of the user on the touch display screen of the terminal device when the touch display screen is in the screen-off mode.

In one implementation, when the first detecting module 401 detects the touch operation of the user on the touch display screen of the terminal device in the screen-off mode of the touch display screen, there is a possibility that the user performs an accidental operation on the touch display screen and therefore, the first starting module 402 needs to start the proximity sensor to further detect whether the touch operation is an accidental operation. The terminal device can be equipped with at least one proximity sensor. When more than one proximity sensor is provided, all or part of the more than one proximity sensor may be started according to a position of the touch operation or other environmental factors. In another implementation, when the touch display screen of the terminal device is in a screen-off mode, the proximity sensor can be turned off or turn to a suspending state, so as to reduce power consumption of the terminal device when the touch screen of the terminal device is in the screen-off mode. Starting the proximity sensor, as mentioned in the context herein, may also include a process of awakening a sensor that is in a suspending state, the disclosure is not limited thereto. The proximity sensor of the implementations of the present disclosure can be an infrared ray proximity sensor, a linear proximity sensor, an ultrasonic proximity sensor, or the like.

The second detecting module 403 is configured to detect, with the proximity sensor, existence of an occlusion within a preset distance in front of the touch display screen.

In one implementation, after the first starting module 402 starts the proximity sensor, the second detecting module 403 can detect, through the started proximity sensor, whether there is an occlusion within the preset distance in front of the touch display screen. For example, the phrases of "in front of the touch display screen" mentioned herein includes but not limited to a direction in which part of the touch display screen is covered or occluded (in other words, blocked) and in which, the occlusion can form a projection on the touch display screen. The occlusion can affect the proximity sensor's judgment of a proximity distance. To this end, a threshold distance may be set in advance (in the following, "preset distance range" for short). When the proximity sensor detects that there is an object within the preset distance range, it indicates that the object is an occlusion of the touch screen of the terminal device. The preset distance can be in a direction perpendicular to the touch display screen. Alternatively, the preset distance can be in any direction on a hemisphere with the preset distance as the radius of the hemisphere and a coordinate point of the touch operation on the touch display screen as a center of the hemisphere. Alternatively, the preset distance can be in any direction on a partial hemisphere, the implementations of the present disclosure are not limited thereto.

As one implementation, at least one detection zone within the preset distance in front of the touch display screen can be determined, whether the total of occlusion coverage area of each detection zone is greater than a preset threshold area is determined by counting the total coverage area of occlusion(s) of each detection zone of the at least one detection zone. When the total is greater than the preset threshold area, it indicates that there is an occlusion, that is, the user may has performed an accidental operation on the touch display screen, and there is no need to launch the application and the touch display screen will remain in the screen-off mode. When the total is smaller than the preset threshold area, it indicates that there is no occlusion, that is, the user wants to launch an application quickly through the touch operation, and the application shall be launched by a second starting module 404 described below. In addition, when a proximity sensor is started, at least one detection zone capable of being sensed by the proximity sensor can be determined. Similarly, when multiple proximity sensors are started, at least one detection zone capable of being sensed generally by the multiple proximity sensors can be determined, for example, the at least one detection zone can be determined with aid of an operating position of the touch operation on the touch display screen.

As one implementation, other means can also be adopted to detect existence of an occlusion within the preset distance in front of the touch display screen. As an example, the proximity sensor is an infrared ray proximity sensor, in this case, the proximity sensor is configured to detect an object in front of the touch display screen through emitting one or more infrared rays, and to determine whether the distance between the object and the touch display screen is within the preset distance based on a duration of reflection of the infrared rays emitted. When the object is within the preset distance, it can be determined that the object is an occlusion, that is, there is an occlusion within the preset distance in front of the touch display screen. As another example, whether or not a coverage range of the object has actually occluded the touch display screen can be further determined with aid of scanning area of infrared rays. When the occlusion coverage range has not occluded the touch display screen, it indicates that there is no occlusion. On the other hand, when the occlusion coverage range has occluded the touch display screen, it indicates that there is an occlusion. It should be understood that, the above operations may also be combined with each other to determine whether there is an occlusion, the implementations of the present disclosure are not limited thereto.

The second starting module 404 can be embodied as a controller and is configured to launch an application corresponding to the touch operation when no occlusion is detected by the second detecting module 403.

In one implementation, when the second detecting module 403 detects that there is no occlusion within the preset distance in front of the touch display screen, it indicates that the touch operation of the user on the touch display screen is not an accidental operation, and the second starting module 404 can launch the application corresponding to the touch operation. As an example, after it is determined that the touch operation is not an accidental operation, the application corresponding to the touch operation can be further determined, and then the application can be launched on the terminal device. Alternatively, the application, such as GPS positioning and the like, can be run in the background after being launched, or a startup interface of the application can be displayed on a display interface of the touch display screen.

According to implementations of the present disclosure, the proximity sensor is started in response to detecting the touch operation of the user on the touch display screen of the terminal device when the touch display screen is in the screen-off mode. Thereafter, existence of an occlusion within the preset distance in front of the touch display screen can be determined with the proximity sensor, so as to determine whether the touch operation of the user is an accidental operation. When there is no occlusion within the preset distance, it means that the touch operation of the user is not an accidental operation, and the application corresponding to the touch operation can be launched, thereby realizing quick launch of an application through the touch operation while avoiding extra power consumption of the terminal device caused by the accidental operation of the user. In addition, the proximity sensor is triggered on condition that there is no occlusion within the preset distance in front of the touch display screen, which can further reduce power consumption of the terminal device caused by long-time operating of the proximity sensor.

Figure 5:
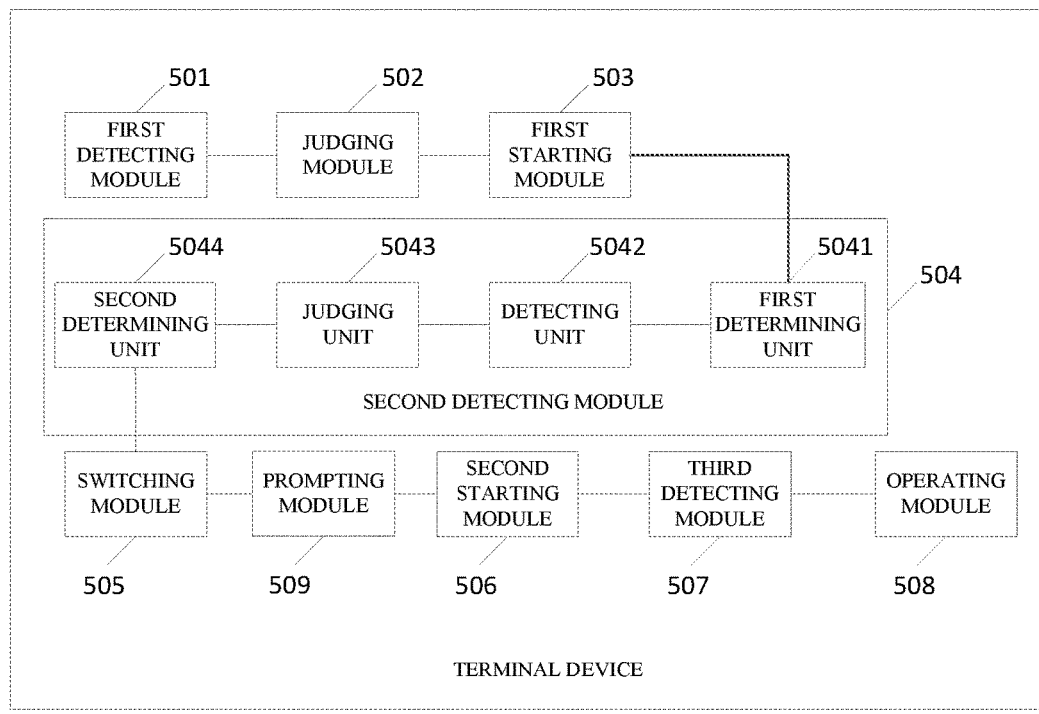
FIG. 5 is a schematic structural diagram illustrating a terminal device according to a second terminal implementation of the present disclosure.

FIG. 5 is a schematic structural diagram illustrating a terminal device according to a second terminal implementation of the present disclosure. As illustrated in FIG. 5, the terminal device described in this implementation includes a first detecting module 501, a judging module 502, a first starting module 503, a second detecting module 504, a switching module 505, a second starting module 506, a third detecting module 507, and an operating module 508.

The first detecting module 501 is configured to detect a touch operation of a user on a touch display screen of the terminal device when the touch display screen is in a screen-off mode.

The judging module 502 is configured to judge whether the touch operation belongs to a touch operation set that is in a mapping relationship with an application set of the terminal device, in response to the first detecting module 501 detecting the touch operation of the user on the touch display screen of the terminal device when the touch display screen is in the screen-off mode.

In one implementation, when the first detecting module 501 detects the touch operation of the user on the touch display screen of the terminal device in the screen-off mode of the touch display screen, the judging module 502 can first determine whether the touch operation belongs to the touch operation set that is in a mapping relationship with the application set of the terminal device. In other words, the judging module 502 first determines whether the touch operation is configured to launch the application. For instance, a mapping relationship table regarding the application set and the touch operation set can be pre-stored in the terminal device, where applications in the application set may correspond to one or more touch operations belong to the touch operation set. Each entry of the mapping relationship table indicates one application and one or more touch operations corresponding to the application. When a touch operation of a user on the touch display screen is detected, search the mapping relationship table for the touch operation detected. When the touch operation is found in the table, it indicates that the touch operation corresponds to an application and the application will be launched. When the terminal fails to find the touch operation in the table, it indicates that the touch operation does not belong to the touch operation set which is in a mapping relationship with the application set; based on this, it can be further determined that the touch operation is not intended to quickly launch the application in the screen-off mode, in other words, the touch operation detected can be regarded as an accidental operation.

For example, the touch operation in the above mapping relationship table can be a touch gesture operation, a touch pressure, and the like. As an example, a touch operation for launching Application 1 may include one or more of the follows: a double-click touch operation, a touch operation of a V-shaped touch gesture, a touch operation with a touch pressure reaching a first preset threshold, and other touch operations. As another example, a touch operation for launching Application 2 may include one or more of the follows: a touch operation with the number of clicks exceeding a preset threshold, a touch operation of an O-shaped touch gesture, and a touch operation with a touch pressure reaching a second preset threshold. The implementations of the present disclosure are not particularly restricted.

The first starting module 503 is configured to start the proximity sensor, when the judging module 502 judges that the touch operation belongs to the touch operation set.

In one implementation, when the judging module 502 judges that the touch operation belongs to the touch operation set, it indicates that the touch operation is configured to launch an application of the terminal device, and the first starting module 503 can be further configured to start the proximity sensor to further determine whether the touch operation is made based on user's intention or it is an accidental operation of the user. For instance, the terminal device can be equipped with at least one proximity sensor. When more than one proximity sensor is provided, all or part of the more than one proximity sensor may be started according to a position of the touch operation or other environmental factors. In a possible implementation, when the touch display screen of the terminal device is in a screen-off mode, the proximity sensor can be turned off or in a suspending state, so as to reduce power consumption of the terminal device when the touch display screen of the terminal device is in a screen-off mode. Starting the proximity sensor, as mentioned in the context herein, may also include a process of awakening a sensor in a suspending state, the implementations of the present disclosure are not limited herein. The proximity sensor of the implementations of the present disclosure may be an infrared ray proximity sensor, a linear proximity sensor, an ultrasonic proximity sensor, or the like.

The second detecting module 504 is configured to detect, with the proximity sensor, existence of an occlusion within a preset distance in front of the touch display screen.

In this implementation of the present disclosure, the second detecting module 504 includes a first determining unit 5041, a detecting unit 5042, a judging unit 5043, and a second determining unit 5044.

The first determining unit 5041 is configured to determine at least one detection zone within the preset distance in front of the touch display screen.

In one implementation, after the first starting module 503 starts the proximity sensor, the first determining unit 5041 can determine the at least one detection zone within the preset distance in front of the touch display screen for the proximity sensor to detect. For example, a detection range of the proximity sensor can be determined first, and the detection range is divided into the at least one detection zone. Alternatively, the at least one detection zone is determined according to an operating position of the touch operation on the touch display screen. Alternatively, the at least one detection zone can be determined by a combination of the above two manners.

The detecting unit 5042 is configured to detect, with the proximity sensor, occlusion coverage area of each detection zone of the at least one detection zone.

In one implementation, after the first determining unit 5041 determines the at least one detection zone, the detecting unit 5042 can detect, with the proximity sensor, the occlusion coverage area of each detection zone of the at least one detection zone. For instance, in the case that one or more proximity sensors are started, the at least one detection zone can be determined based on a detectable range of the proximity sensors, the operating position of the touch operation, or a combination of the above two manners. Then the proximity sensor can detect the occlusion coverage area of each detection zone of the at least one detection zone determined. The importance or priority of each detection zone may be preset to be the same or different. For example, if the importance of each detection zone is different, for each detection zone, the occlusion coverage area thereof can be represented as the result obtained by multiplying the occlusion coverage area and a corresponding weight value representing the importance of the detection zone.

The judging unit 5043 is configured to judge whether the total of the occlusion coverage area of each detection zone is greater than a preset threshold area.

In one implementation, after the occlusion coverage area of each detection zone is determined as mentioned above, the total of the occlusion coverage area of each detection zone can be obtained. When the judging unit 5043 judges that the total of the occlusion coverage area of each detection zone is greater than the preset threshold area, it means that there is an occlusion within the preset distance in front of the touch display screen. On the other hand, when the judging unit 5043 judges that the total of the occlusion coverage area of each detection zone is less than the preset threshold area, it means that there is no occlusion within the preset distance in front of the touch display screen, which in turn indicates that the user wants to launch the application quickly through the touch operation on the touch display screen.

The second determining unit 5044 is configured to determine that there is no occlusion when the judging unit 5043 judges that the total is not greater than the preset threshold area.

The switching module 505 is configured to switch the touch display screen from the screen-off mode to a screen-on mode.

In one implementation, when the second determining unit 5044 determines that there is no occlusion within the preset distance in front of the touch display screen, the switching module 505 can switch the touch display screen from the screen-off mode to the screen-on mode, to prepare for displaying a startup interface of the application or a function interface after the application is launched. It should be noted that, the terminal device may further include a prompting module 509. The prompting module 509 is configured to, before the application is launched, prompt the user to enter permission for launching the application when the touch display screen is in the screen-on mode, to ensure the security of the application.

The second starting module 506 is configured to launch an application corresponding to the touch operation.

In one implementation, after the switching module 505 switches the touch display screen from the screen-off mode to the screen-on mode, the second starting module 506 can launch the application corresponding to the touch operation of the user. A startup interface or a function interface of the application can be displayed on the touch display screen. In this case, the proximity sensor can be closed or enter a suspending state.

The third detecting module 507 is configured to detect, in the application, existence of an action item in a mapping relationship with the touch operation.

In one implementation, the above touch operation of the user can be in a mapping relationship (in other words, correspondence relationship) with action items of the application. For example, when the application is a music player, action items of the application can relate to "previous song", "next song", "fast forward", "fast rewind", "volume adjustment", and so on. Each action item further corresponds to a touch operation, for instance, when the touch operation is to slide the screen to the right, an action item corresponding thereto is "fast forward". Based on this, the third detecting module 507 can detect existence of an action item which is in a mapping relationship with the above touch operation to further speed up the process of launching an application, since operations on the action item(s) of the application can be completed while launching the application, richer operation functions can be achieved with simpler operations.

The operating module 508 is configured to operate on the action item based on the touch operation when the third detecting module 507 detects that there is the action item corresponding to the touch operation of the user.

In one implementation, when the third detecting module 507 detects there is the action item in a mapping relationship with the touch operation, the operating module 508 can operate on the action item in the application based on the touch operation. For example, when the action item corresponding to the above touch operation is to adjust volume, the volume of the application can be adjusted according to the touch operation. Further, suppose the touch operation is associated with a touch pressure, the volume of the application will be reduced when the touch pressure of the touch operation is reduced; likewise, the volume of the application will be increased accordingly when the touch pressure of the touch operation is increased. It should be appreciated that, there may be other mapping relationships between the touch operation and action items of the application, and the present disclosure is not limited thereto.

According to the implementations of the present disclosure, after the terminal device detects the touch operation of the user on the touch display screen in the screen-off mode of the touch display screen, the terminal device may further recognize the touch operation so as to determine whether the touch operation is an accidental operation with the proximity sensor, and thereby improving the accuracy of recognizing whether the touch operation is an accidental operation. Further, when determining that the touch operation is not an accidental operation and the application is launched, operations corresponding to the action item of the application will be conducted based on the touch operation, which simplifies user operation in terms of operations on the application.

Figure 6:
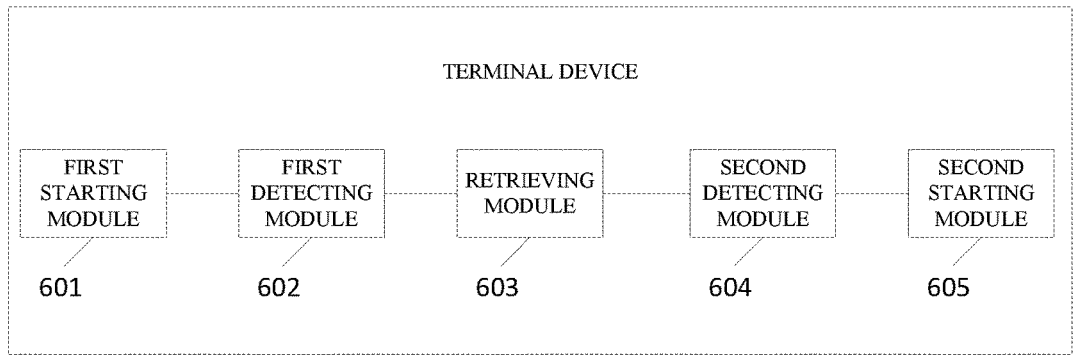
FIG. 6 is a schematic structural diagram illustrating a terminal device according to a third terminal implementation of the present disclosure.

FIG. 6 is a schematic structural diagram illustrating a terminal device according to a third terminal implementation of the present disclosure. Functions of the modules included in the terminal device illustrated in FIG. 6 may be a supplement to that of the terminal device illustrated in FIG. 4 or FIG. 5. The terminal device illustrated in FIG. 6 may include all or part of the modules illustrated in FIG. 4 or FIG. 5; for those modules operating in the same or similar way, they are not illustrated in FIG. 6 to avoid redundancy. As illustrated in FIG. 6, the terminal device includes a first starting module 601, a first detecting module 602, a retrieving module 603, a second detecting module 604, and a second starting module 605.

The first starting module 601 is configured to start a proximity sensor.

The first detecting module 602 is configured to detect, with the proximity sensor, whether there is an occlusion within a preset distance in front of a touch display screen.

In one implementation, for the manner of operation of the first starting module 601 and the first detecting module 602, reference can be made to corresponding module in the above implementation, and will not be repeated here.

The retrieving module 603 is configured to retrieve, from an application set, at least one application in a mapping relationship with the touch operation when no occlusion is detected.

In one implementation, when no occlusion within the preset distance in front of the touch display screen is detected with the proximity sensor, proceed to the process of launching an application. For instance, at least one application in a mapping relationship with the touch operation can be retrieved from the application set of the terminal device. In the implementations of the present disclosure, the touch operation may correspond to multiple applications. If the touch operation is not an accidental operation of the user, the following operations may be carried out to determine which application of the multiple applications corresponding to the touch operation will be launched. It should be understood that, more than one application can be launched at the same time through the touch operation; the disclosure is not limited thereto.

The second detecting module 604 is configured to detect, with the proximity sensor, a relative movement (in other words, relative movement relationship) between a target object and the touch display screen.

In one implementation, after at least one application in a mapping relationship with the touch operation is retrieved, the relative movement between the target object and the touch display screen can be further determined with the proximity sensor. The proximity sensor, together with a device such as a camera configured in the terminal device, can determine the target object, and the target object can be the face, hands, or other objects having target features of the user. Thereafter, the relative movement between the target object and the touch display screen is detected. The movement relationship can be a close relationship, a distant relationship, and the like. It should be appreciated that, the proximity sensor can also detect other movement relationships with aid of other sensors, such as a left-shift relationship or a right-shift relationship. Different movement relationships may correspond to different applications retrieved.

The second starting module 605 is configured to launch, among the at least one application, an application corresponding to the relative movement.

In one implementation, after the relative movement between the target object and the touch display screen is detected, based on the relative movement, in the retrieved at least one application, the application corresponding to the relative movement may be launched. As an example, different movement relationships may correspond to different applications of the at least one application. As another example, the retrieved at least one application may be sorted with sequence numbers, and different movement relationships correspond to different sequence numbers. As yet another example, the movement relationship may also include parameters such as a movement acceleration, a movement rate, a movement range, and the like of the target object in relative to the touch display screen. A specific application can be determined according to different movement parameters of a movement relationship.

According to implementations of the present disclosure, the terminal device can launch multiple applications with the proximity sensor, or determine from the at least one application corresponding to the touch operation an application to be launched based on the relative movement between the target object and the touch display screen. In this case, launching of an application becomes more accurate.

Figure 7:
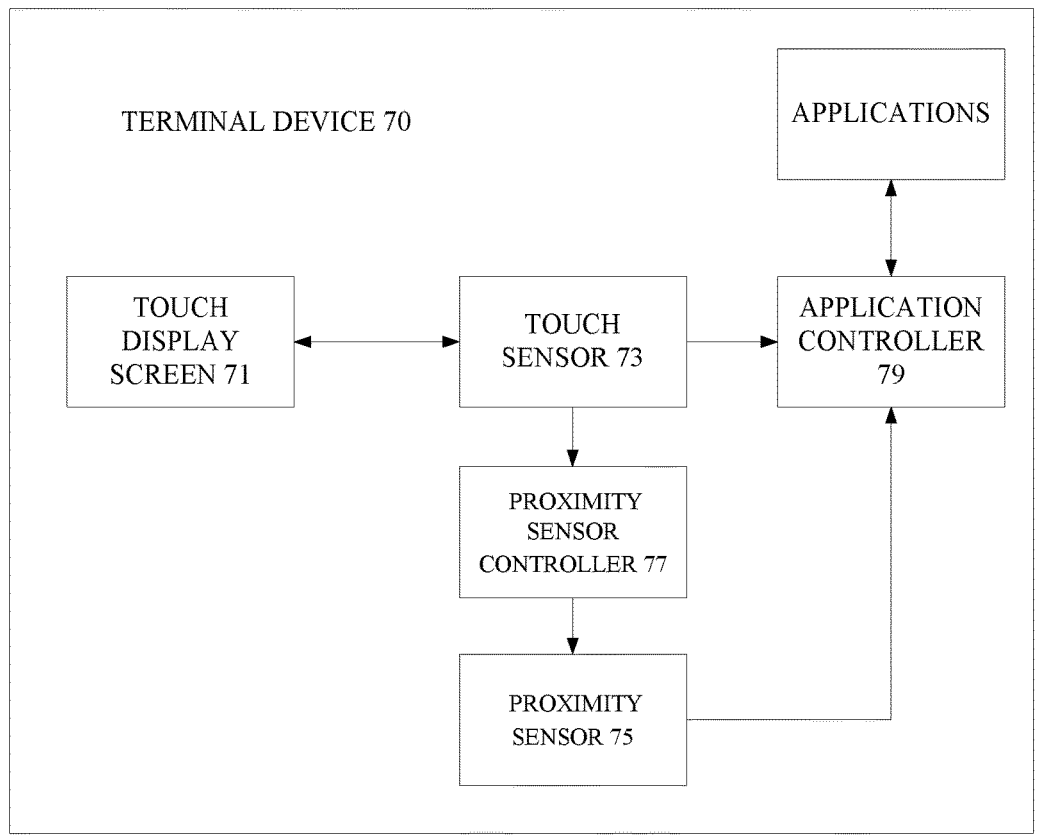
FIG. 7 is a schematic structural diagram illustrating a terminal device according to a fourth terminal implementation of the present disclosure.

FIG. 7 is a schematic structural diagram illustrating a terminal device according to a fourth terminal implementation of the present disclosure. As illustrated in FIG. 7, the terminal device 70 includes a touch display screen 71, a touch sensor 73, a proximity sensor 75, a proximity sensor controller 77, and an application controller 79. For ease of explanation, only one proximity sensor 75 is illustrated in the figure, however, the terminal device 70 may be provided with more than one proximity sensor, and one or more proximity sensors can be started simultaneously.

The touch display screen 71 is generally configured to receive a touch operation of a user. The touch operation can be made at the user's discretion or the touch operation may be an accidental operation.

The touch sensor 73 is coupled with the touch display screen 71 and is configured to detect the touch operation of a user on the touch display screen 71. The touch sensor 73 may have a sensing array for touch operation detection.

The proximity sensor 75 is configured to detect existence of an occlusion within a preset distance in front of the touch display screen 71. In one implementation, the proximity sensor 75 is an infrared ray proximity sensor and is configured to detect existence of the occlusion based on at least one of reflection duration and scanning area of infrared rays emitted therefrom.

The proximity sensor controller 77 is configured to control the proximity sensor 75 to be enabled, according to the detection of the touch operation by the touch sensor 73. Specifically, the proximity sensor controller 77 is configured to control the proximity sensor 75 to be enabled when the touch operation is detected by the touch sensor 73. Under control of the proximity sensor controller 77, the proximity sensor 75 can be started or switches to a suspending state.

The application controller 79 is configured to launch an application corresponding to the touch operation detected by the touch sensor 73, according to the detection of the occlusion by the proximity sensor 75. Specifically, the application controller 79 is configured to launch an application corresponding to the touch operation detected by the touch sensor 73 when no occlusion is detected by the proximity sensor 75. The application controller 79 has access to and can manage multiple applications running on the terminal device.

In one implementation, the proximity sensor 75 is further configured to determine movement of a target object in relative to the touch display screen. In this case, the application controller 79 is configured to determine at least one application in a mapping relationship with the touch operation and launch, among the at least one application, an application corresponding to the movement of the target object that is detected by the proximity sensor 75.

In one implementation, the proximity sensor controller 77 is further configured to determine whether the touch operation belongs to a touch operation set corresponding to an application set of the terminal device and start the proximity sensor 75 based on a determination that the touch operation belongs to the touch operation set.

In one implementation, the proximity sensor 75 configured to detect existence of the occlusion is configured to: determine at least one detection zone within the preset distance in front of the touch display screen; determine occlusion coverage area of each detection zone of the at least one detection zone; determine whether the total of the occlusion coverage area of each detection zone is greater than a preset threshold area; determine that there is no occlusion based on a determination that the total is not greater than the preset threshold area.

Figure 8:
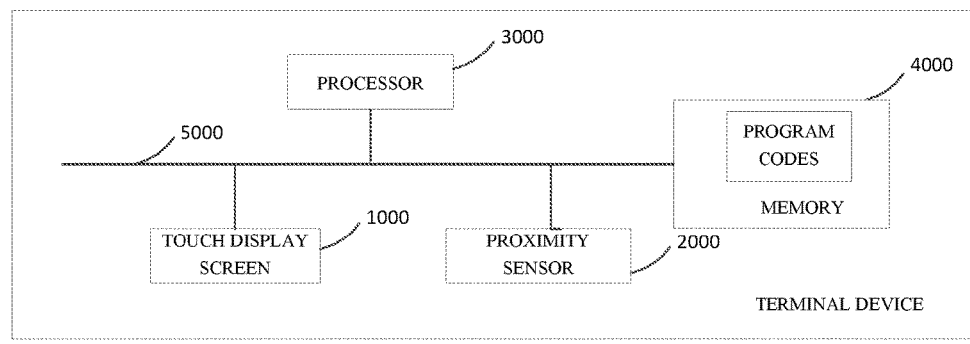
FIG. 8 is a schematic structural diagram illustrating a terminal device according to a fourth terminal implementation of the present disclosure.

FIG. 8 is a schematic structural diagram illustrating a terminal device according to a fourth terminal implementation of the present disclosure. As illustrated in FIG. 8, the terminal device described in this implementation includes a touch display screen 1000, at least one proximity sensor 2000, at least one processor 3000 (for example, a CPU), a memory 4000, and a bus 5000. The touch display screen 1000, the at least one proximity sensor 2000, the at least one processor 3000, and the memory 4000 are coupled via the bus 5000.

The above at least one proximity sensor 2000 can be embedded in the touch display screen 1000. As illustrated in FIG. 8, the above at least one proximity sensor 2000 can also be independent from the touch display screen 1000.

The above-mentioned memory 4000 may be a high-speed random access memory (RAM) memory or a non-transitory memory such as a disk memory. The above memory 4000 is configured to store a set of program codes. The above processor 3000 is configured to invoke the program codes stored in the memory 4000 to perform the following operations.

A proximity sensor is started in response to a touch operation of a user detected on a touch display screen of a terminal device when the touch display screen is in a screen-off mode. Existence of an occlusion within a preset distance in front of the touch display screen is detected with the proximity sensor. An application corresponding to the touch operation is launched when no occlusion is detected.

As one implementation, before the proximity sensor is started, the processor 3000 is further configured to invoke the program codes stored in the memory 4000 to judge whether the touch operation belongs to a touch operation set that is in a mapping relationship with an application set of the terminal device.

Starting the proximity sensor may include the follows. The proximity sensor is started based on a judgment that the touch operation belongs to the touch operation set.

As one implementation, the manner in which the processor 3000 detects, with the proximity sensor, existence of an occlusion within the preset distance in front of the touch display screen is as follows.

At least one detection zone within the preset distance in front of the touch display screen is determined. Occlusion coverage area of each detection zone of the at least one detection zone is detected with the proximity sensor. For each detection zone, judge whether the total of the occlusion coverage area thereof is greater than a preset threshold area. Determine that there is no occlusion when the total is not greater than the preset threshold area.

As one implementation, before the application corresponding to the touch operation is launched, the processor 3000 is further configured to invoke the program codes stored in the memory 4000 to switch the touch display screen from the screen-off mode to a screen-on mode.

As one implementation, after the application corresponding to the touch operation is launched, the processor 3000 is further configured to invoke program codes stored in the memory 4000 to perform the following operations.

In the application, existence of an action item in a mapping relationship with the touch operation is detected. When it is detected there is an action item in a mapping relationship with the touch operation, operate on the action item based on the touch operation.

Implementations of the present disclosure further provide a mobile terminal. The mobile terminal includes a memory, a processor, and at least one proximity sensor. The processor is coupled with the memory and the at least one proximity sensor. The processor is configured to invoke executable program codes stored in the memory to perform part or all of the operations of any of the methods described in the foregoing method implementations.

Implementations of the present disclosure further provide a computer storage medium. The computer storage medium is configured to store programs which, when executed, can be operable to accomplish part or all of the operations of any of the methods described in the foregoing method implementations.

In the foregoing implementations, the description of each implementation has its own emphasis. For the parts not described in detail in one implementation, reference may be made to related descriptions in other implementations.

It is to be noted that, for the sake of simplicity, the foregoing method implementations are described as a series of action combinations, however, it will be appreciated by those skilled in the art that the present disclosure is not limited by the sequence of actions described. That is because that, according to the present disclosure, certain steps or operations may be performed in other order or simultaneously. Besides, it will be appreciated by those skilled in the art that the implementations described in the specification are exemplary implementations and the actions and modules involved are not necessarily essential to the present disclosure.

In the foregoing implementations, the description of each implementation has its own emphasis. For the parts not described in detail in one implementation, reference may be made to related descriptions in other implementations.

In the implementations of the disclosure, it should be understood that, the apparatus disclosed in implementations provided herein may be implemented in other manners. For example, the device/apparatus implementations described above are merely illustrative; for instance, the division of the unit is only a logical function division and there can be other manners of division during actual implementations, for example, multiple units or components may be combined or may be integrated into another system, or some features may be ignored, omitted, or not performed. In addition, coupling or communication connection between each illustrated or discussed component may be direct coupling or communication connection, or may be indirect coupling or communication among devices or units via some interfaces, and may be electrical connection or other forms of connection.

The units described as separate components may or may not be physically separated, the components illustrated as units may or may not be physical units, that is, they may be in the same place or may be distributed to multiple network elements. Part or all of the units may be selected according to actual needs to achieve the purpose of the technical solutions of the implementations.

In addition, the functional units in various implementations of the present disclosure may be integrated into one processing unit, or each unit may be physically present, or two or more units may be integrated into one unit. The above-mentioned integrated unit can be implemented in the form of hardware or a software function unit.

The integrated unit may be stored in a computer-readable memory when it is implemented in the form of a software functional unit and is sold or used as a separate product. Based on such understanding, the technical solutions of the present disclosure essentially, or the part of the technical solutions that contributes to the related art, or all or part of the technical solutions, may be embodied in the form of a software product which is stored in a memory and includes instructions for causing a computer device (which may be a personal computer, a server, or a network device and so on) to perform all or part of the operations described in the various implementations of the present disclosure. The memory includes various medium capable of storing program codes, such as a universal serial bus (USB), a read-only memory (ROM), a random access memory (RAM), a removable hard disk, Disk, compact disc (CD), or the like.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for launching an application, comprising:
   determining, in response to detecting that a touch operation is performed on a touch display screen of a mobile terminal when the touch display screen is in a screen-off mode, whether the touch operation is a target touch operation;
   determining, in response to determining that the touch operation on the touch display screen is the target touch operation, whether an occlusion exists in front of the touch display screen;
   determining, in response to determining that no occlusion exists, whether the target touch operation corresponds to at least two applications installed in the mobile terminal according to a correspondence between touch operations and applications installed in the mobile terminal;
   detecting, in response to determining that the target touch operation corresponds to the at least two applications, a movement of a target object relative to the touch display screen, wherein the target object is part of a human body facing the touch display screen; and
   launching a target application in the at least two applications according to the movement of the target object relative to the touch display screen and a one-to-one correspondence between movements of the target object relative to the touch display screen and the applications installed in the mobile terminal.

2. The method of claim 1, further comprising the following prior to launching the target application in the at least two applications:
   switching the touch display screen to a screen-on mode from the screen-off mode.

3. The method of claim 1, further comprising the following after launching the target application in the at least two applications:
   enabling a function of the target application according to the target touch operation.

4. The method of claim 1, wherein determining, in response to determining that the touch operation on the touch display screen is the target touch operation, whether the occlusion exists in front of the touch display screen comprises:
   determining at least two detection zones within a preset distance in front of the touch display screen;
   obtaining an area of covered part of each of the at least two detection zones, importance of the at least two detection zones being different from each other, the area of the covered part of each of the at least two detection zones being obtained by multiplying the area of the covered part of each of the at least two detection zones and a weight value representing the importance of each of the at least two detection zones;
   obtaining a total area of covered part of the at least two detection zones by adding up the area of the covered part of each of the at least two detection zones; and
   determining that there is no occlusion when the total area fails to exceed a preset threshold.

5. The method of claim 1, further comprising:
determining, in response to determining that the occlusion exists, that the target touch operation is an accidental operation.

6. The method of claim 2, further comprising:
prompting a user for a permission to launch the target application, when the touch display screen is in the screen-on state.

7. A mobile terminal, comprising:
a processor; and
a computer readable memory, coupled to the processor and storing at least one computer executable instruction therein, which, when executed by the processor, causes the processor to carry out actions comprising:
determining, in response to detecting that a touch operation is performed on a touch display screen of the mobile terminal when the touch display screen is in a screen-off mode, whether the touch operation is a target touch operation;
determining, in response to determining that the touch operation on the touch display screen is the target touch operation, whether an occlusion exists in front of the touch display screen;
determining, in response to determining that no occlusion exists, whether the target touch operation corresponds to at least two applications installed in the mobile terminal according to a correspondence between touch operations and applications installed in the mobile terminal;
detecting, in response to determining that the target touch operation corresponds to the at least two applications, a movement of a target object relative to the touch display screen, wherein the target object is part of a human body facing the touch display screen; and
launching a target application in the at least two applications according to the movement of the target object relative to the touch display screen and a one-to-one correspondence between movements of the target object relative to the touch display screen and the applications installed in the mobile terminal.

8. The mobile terminal of claim 7, wherein the processor is further caused to carry out an action, comprising:
switching the touch display screen to a screen-on mode from the screen-off mode.

9. The mobile terminal of claim 7, wherein the processor is further caused to carry out an action, comprising:
enabling a function of the target application according to the target touch operation.

10. The mobile terminal of claim 7, wherein the executable instructions that cause the processor to carry out determining, in response to determining that the touch operation on the touch display screen is the target touch operation, whether the occlusion exists in front of the touch display screen is configured to carry out actions, comprise:
determining at least two detection zones within a preset distance in front of the touch display screen;
obtaining an area of covered part of each of the at least two detection zones, importance of the at least two detection zones being different from each other, the area of the covered part of each of the at least two detection zones being obtained by multiplying the area of the covered part of each of the at least two detection zones and a weight value representing the importance of each of the at least two detection zones;
obtaining a total area of covered part of the at least two detection zones by adding up the area of the covered part of each of the at least two detection zones; and
determining that there is no occlusion when the total area fails to exceed a preset threshold.

11. The mobile terminal of claim 7, wherein the processor is further caused to carry out an action, comprising:
determining, in response to determining that the occlusion exists, that the target touch operation is an accidental operation.

12. The mobile terminal of claim 8, wherein the processor is further caused to carry out an action, comprising:
prompting a user for a permission to launch the target application, when the touch display screen is in the screen-on state.

13. A non-transitory computer storage medium, configured to store programs which, when executed, are operable to perform:
determining, in response to detecting that a touch operation is performed on a touch display screen of a mobile terminal when the touch display screen is in a screen-off mode, whether the touch operation is a target touch operation;
determining, in response to determining that the touch operation on the touch display screen is the target touch operation, whether an occlusion exists in front of the touch display screen;
determining, in response to determining that no occlusion exists, whether the target touch operation corresponds to at least two applications installed in the mobile terminal according to a correspondence between touch operations and applications installed in the mobile terminal;
detecting, in response to determining that the target touch operation corresponds to the at least two applications, a movement of a target object relative to the touch display screen, wherein the target object is part of a human body facing the touch display screen; and
launching a target application in the at least two applications according to the movement of the target object relative to the touch display screen and a one-to-one correspondence between movements of the target object relative to the touch display screen and the applications installed in the mobile terminal.

14. The non-transitory computer storage medium of claim 13, wherein the programs are operable to perform the following:
switching the touch display screen to a screen-on mode from the screen-off mode.

15. The non-transitory computer storage medium of claim 13, wherein the programs are operable to perform the following:
enabling a function of the target application according to the target touch operation.

16. The non-transitory computer storage medium of claim 13, wherein the programs operable to perform determining, in response to determining that the touch operation on the touch display screen is the target touch operation, whether the occlusion exists in front of the touch display screen comprise:
determining at least two detection zones within a preset distance in front of the touch display screen;
obtaining an area of covered part of each of the at least two detection zones, importance of the at least two detection zones being different from each other, the area of the covered part of each of the at least two detection zones being obtained by multiplying the area of the covered part of each of the at least two detection zones and a weight value representing the importance of each of the at least two detection zones;

obtaining a total area of covered part of the at least two detection zones by adding up the area of the covered part of each of the at least two detection zones; and determining that there is no occlusion when the total area fails to exceed a preset threshold.

17. The non-transitory computer storage medium of claim 13, wherein the programs are operable to perform the following:

determining, in response to determining that the occlusion exists, that the target touch operation is an accidental operation.

18. The non-transitory computer storage medium of claim 14, wherein the programs are operable to perform the following:

prompting a user for a permission to launch the target application, when the touch display screen is in the screen-on state.

* * * * *